(12) United States Patent
Cheng et al.

(10) Patent No.: US 12,131,962 B2
(45) Date of Patent: Oct. 29, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Kuang-Wei Cheng, Hsinchu (TW); Yung-Tsun Liu, Taipei (TW); Chih-Tsung Lee, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 449 days.

(21) Appl. No.: 17/446,242

(22) Filed: Aug. 27, 2021

(65) Prior Publication Data

US 2022/0367297 A1 Nov. 17, 2022

Related U.S. Application Data

(60) Provisional application No. 63/201,810, filed on May 13, 2021.

(51) Int. Cl.
*C23C 16/52* (2006.01)
*C23C 16/455* (2006.01)
(Continued)

(52) U.S. Cl.
CPC ........ *H01L 22/26* (2013.01); *C23C 16/45525* (2013.01); *C23C 16/52* (2013.01); *H01L 21/0228* (2013.01); *H01L 21/0217* (2013.01)

(58) Field of Classification Search
CPC . H01L 22/26; H01L 21/0228; H01L 21/0217; H01L 21/67017; H01L 21/67288; C23C 16/45525; C23C 16/52; C23C 16/45561; C23C 16/45544; H01J 37/32357; H01J 37/3244; H01J 37/32449; F16K 7/12; F16K 37/0041
(Continued)

(56) References Cited

U.S. PATENT DOCUMENTS

2002/0192369 A1* 12/2002 Morimoto ......... C23C 16/45561
118/712
2005/0109419 A1* 5/2005 Ohmi ..................... B01D 53/68
222/3
(Continued)

*Primary Examiner* — Rudy Zervigon
(74) *Attorney, Agent, or Firm* — Harrity & Harrity, LLP

(57) ABSTRACT

A diaphragm position of a valve may be detected and/or determined such that operation of the diaphragm may be monitored. A sensor included in the valve may generate sensor data that may be used to monitor the position of the diaphragm, which in turn may be used to determine a flow of a fluid through the valve. In this way, the sensor may be used to determine whether the diaphragm is properly functioning, may be used to identify and detect failures of the diaphragm, and/or may be used to quickly terminate operation of an associated deposition tool. This may reduce semiconductor substrate scrap, may reduce device failures on semiconductor substrates that are processed by the deposition tool, may increase semiconductor processing quality of the deposition tool, and/or may increase semiconductor processing yields of the deposition tool.

20 Claims, 12 Drawing Sheets

(51) Int. Cl.
*H01L 21/02* (2006.01)
*H01L 21/66* (2006.01)

(58) Field of Classification Search
USPC ............... 118/715; 156/345.33, 345.34; 251/129.17, 212, 331, 335.2
See application file for complete search history.

(56) References Cited

U.S. PATENT DOCUMENTS

| | | | | |
|---|---|---|---|---|
| 2005/0241763 | A1* | 11/2005 | Huang | C23C 16/45565 156/345.33 |
| 2006/0128127 | A1* | 6/2006 | Seo | C23C 16/34 438/584 |
| 2023/0136494 | A1* | 5/2023 | Yoshida | H01L 21/67069 137/551 |

* cited by examiner

SEMICONDUCTOR PROCESSING TOOL AND METHODS OF OPERATION

CROSS-REFERENCE TO RELATED APPLICATION

This patent application claims priority to U.S. Provisional Patent Application No. 63/201,810, filed on May 13, 2021, and entitled "SEMICONDUCTOR PROCESSING TOOL AND METHODS OF OPERATION." The disclosure of the prior application is considered part of and is incorporated by reference into this patent application.

BACKGROUND

Atomic layer deposition (ALD) is a deposition technique that is used in the semiconductor manufacturing industry to form thin, conformal films with atomic level thickness control. An ALD operation includes the use of sequential gas-phase precursors (or reactants) that each separately reacts with a surface of a material in a self-limiting manner. A first gas-phase precursor is introduced into a processing chamber to react with the surface of the material. The first gas-phase precursor is then removed from the processing chamber, and a second gas-phase precursor is introduced into the processing chamber to react with the surface of the material. This alternating process is repeated to grow or otherwise form a film on the surface in a highly-controlled manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
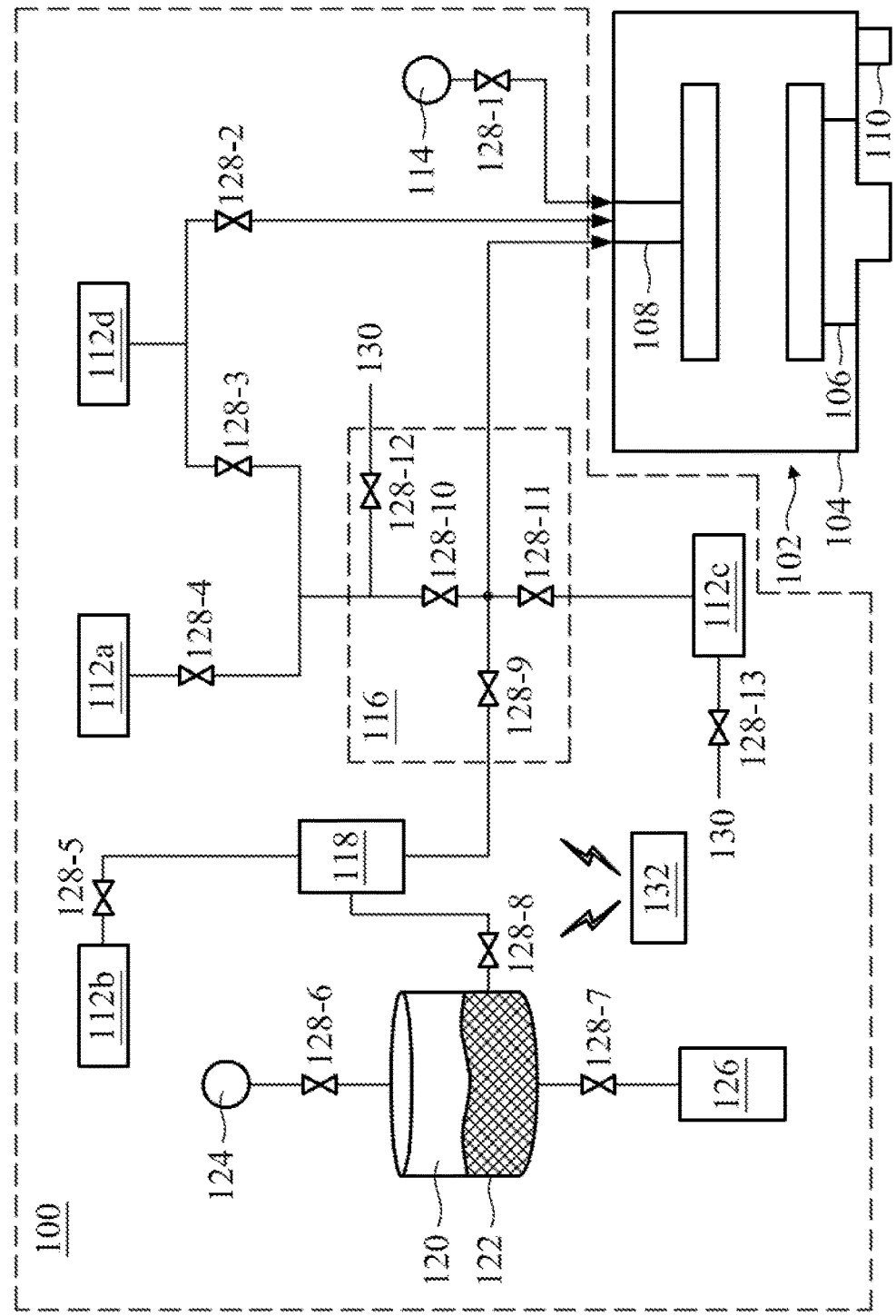
FIG. 1 is a diagram of an example vapor delivery system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An atomic layer deposition (ALD) tool may be coupled to a vapor delivery system that is configured to provide gas-phase (or vaporized) precursors to a processing chamber of the ALD tool. The vapor delivery system typically includes valves (e.g., ALD valves) that are configured to control the flow of liquid-phase and/or gas-phase precursors to the processing chamber and/or to various parts of the vapor delivery system. These valves may be diaphragm-based and may control the flow of liquid-phase and/or gas-phase precursors based on deformation of a diaphragm.

In some cases, a valve in the vapor delivery system may suffer from an "unopened" valve failure or another type of failure where a diaphragm of the valve fails to properly open. This may lead to a reduced (or completely blocked) flow of precursors to the processing chamber of the ALD tool. As a result of the reduced or blocked flow of precursors, thickness and/or uniformity issues may develop on semiconductor substrates that are processed in the processing chamber. This may increase semiconductor substrate scrap, may increase device failures on the semiconductor substrates, may reduce semiconductor processing quality of the ALD tool, and/or may decrease semiconductor processing yields. Moreover, the unopened valve failure can go undetected for a long period of time, which can lead to a large quantity of semiconductor substrates (e.g., 50 semiconductor substrates or more) being affected by the unopened valve failure before the unopened valve failure is detected.

Some implementations described herein enable a diaphragm position of a valve (e.g., that is to be included in a vapor delivery system of a semiconductor processing tool such as an ALD tool) to be detected and/or determined such that operation of the diaphragm may be monitored. A sensor included in the valve may generate sensor data that may be used to monitor the position of the diaphragm, which in turn may be used to determine a flow of a fluid (e.g., a liquid-based or gas-based precursor flow, a carrier gas flow) through the valve. In this way, the sensor (and the sensor data generated by the sensor) may be used to determine whether the diaphragm is properly functioning (e.g., whether the diaphragm is opening and closing as intended), may be used to identify and detect failures of the diaphragm, and/or may be used to quickly terminate operation of the ALD tool. This may enable the quick detection of an unopened valve failure, which may reduce the likelihood that an ALD operation is performed in the presence of the unopened valve failure. This may reduce semiconductor substrate scrap, may reduce device failures on semiconductor substrates that are processed by the ALD tool, may increase semiconductor processing quality of the ALD tool, and/or may increase semiconductor processing yields of the ALD tool.

FIG. 1 is a diagram of an example vapor delivery system 100 described herein. As shown in FIG. 1, the vapor delivery system 100 may be associated with (and coupled to) a deposition tool 102 such as an ALD tool or another type of deposition tool. The vapor delivery system 100 is configured to selectively provide vaporized precursors, purge gasses, and plasma precursors to the deposition tool 102 such that a deposition operation (e.g., an ALD operation) may be performed by the deposition tool 102.

As shown in FIG. 1, the deposition tool 102 includes a processing chamber 104. The processing chamber 104 includes an ALD processing chamber or another type of deposition processing chamber. In the processing chamber 104, a substrate stage 106 is included to support a semiconductor substrate that is to be processed in the processing chamber 104. The substrate stage 106 includes a pedestal, an electrostatic chuck (e-chuck), a mechanical chuck, a vacuum chuck, or another type of device that is capable of supporting a semiconductor substrate. A showerhead 108 is positioned over the substrate stage 106 in the processing chamber 104. The showerhead 108 includes a device that is configured to selectively provide various precursors (e.g., vaporized precursors), purge gasses, and/or plasmas to the processing chamber 104 from the vapor delivery system 100. A vacuum pump 110 is included to evacuate and/or otherwise remove gasses, precursors, and/or other matter from the processing chamber 104.

In an example deposition operation (e.g., an example ALD operation), a precursor is provided from the vapor delivery system 100 into the processing chamber 104 through the showerhead 108. The precursor is absorbed onto the surface of a semiconductor substrate on the substrate stage 106. In some implementations, the precursor is supplied to the processing chamber 104 until the surface of the semiconductor substrate reaches an absorption-limited state. Then, unabsorbed precursors are evacuated from the processing chamber 104 by the vacuum pump 110. A plasma (e.g., a nitrogen-based plasma, an oxygen-based plasma) is generated remotely in the vapor delivery system 100 and introduced into the processing chamber 104 (e.g., through the showerhead 108) such that the plasma reacts with the absorbed precursor on the surface of the semiconductor substrate. In these implementations, the vapor delivery system 100 may be referred to as an ALD supply system. Alternatively, a plasma precursor gas may be provided from the vapor delivery system 100 to the processing chamber 104 through the showerhead 108, and the plasma may be generated in the processing chamber 104 by exciting the plasma precursor gas with a radio frequency (RF) source. In these implementations, the vapor delivery system 100 may be referred to as an ALD precursor delivery system. Finally, by-products and desorbed precursors are removed from the processing chamber 104 (e.g., during and/or after the plasma operation). The above-described process is referred to as an ALD cycle, and a plurality of ALD cycles may be performed to deposit a layer or a film on the semiconductor substrate to the desired thickness.

As shown in FIG. 1, the vapor delivery system 100 includes a plurality of components (e.g., plumbing components). The components may be configured in fluid communication by various types of plumbing fixtures, including pipes/tubes, couplings, reducers, unions, and/or adapters, among other examples.

The vapor delivery system 100 includes a plurality of manifolds 112a-112d through which gasses are introduced into the vapor delivery system 100. Each of the manifolds 112a-112d is configured to selectively provide one or more types of gasses. The manifold 112a is configured to provide a co-reactant gas to the showerhead 108. The co-reactant gas may include a nitrogen ($N_2$) containing reactant gas, such as ammonia ($NH_3$), a silicon containing co-reactant gas such as silane ($SiH_4$), and/or another type of gas. The manifold 112b is configured to provide one or more carrier gasses, such as nitrous oxide ($N_2O$), ammonia ($NH_3$), oxygen ($O_2$), helium (He), argon (Ar), nitrogen ($N_2$), and/or nitrogen fluoride ($NF_3$), among other examples. The manifold 112c is configured to provide gasses such as nitrous oxide ($N_2O$), oxygen ($O_2$), and argon (Ar). The manifold 112d is configured to provide one or more gasses (e.g., purge gasses) to purge precursors from one or more components and/or plumbing fixtures of the vapor delivery system 100 (e.g., to purge residual precursors after the precursors are provided to the processing chamber 104). The manifold 112d may also provide one or more gasses (e.g., purge gasses) directly to the showerhead 108 to purge the processing chamber 104, as described above.

The vapor delivery system 100 includes a plasma source 114. In some implementations, the plasma source 114 includes a remote plasma source configured to provide a plasma (e.g., an oxygen-based plasma, a nitrogen-based plasma) to the showerhead 108. In some implementations, the plasma source 114 includes a plasma precursor gas source configured to provide a plasma precursor gas (e.g., nitrogen fluoride ($NF_3$) gas or another plasma precursor gas) to the showerhead 108.

The vapor delivery system 100 includes a point-of-use valve manifold (PVM) 116, which includes a plurality of valves that are configured to direct the flow of vaporized precursors and purge gasses to the showerhead 108. The PVM 116 may be located at or near the "point-of-use" of the vaporized precursors and purge gasses, which refers to the close proximity of the PVM 116 to the showerhead 108. The PVM 116 may receive vaporized precursors and purge gasses from the manifolds 112a, 112c, and 112b, and from a heated injector manifold (HIM) 118, among other sources.

The HIM 118 includes an injector manifold that receives heated carrier gasses from the manifold 112b and vaporized precursors from an ampoule 120, and mixes the heated carrier gasses and the vaporized precursors. The mixture of heated carrier gasses and the vaporized precursors is provided to the PVM 116. The ampoule 120 includes a container configured to store a liquid precursor 122 and to heat the liquid precursor 112 to generate the vaporized precursors that are injected into the HIM 118. The vaporized precursors may be carried to the HIM 118 by a carrier gas, which is provided by a carrier gas source 124. The supply of the liquid precursor 122 may be replenished from time to time from a bulk storage container 126.

As further shown in FIG. 1, the vapor delivery system 100 includes a plurality of valves 128 (e.g., valves 128-1 through 128-13). The valves 128 may be located in-line and/or along the plumbing fixtures between the components of the vapor delivery system 100, within one or more components of the vapor delivery system 100, and/or between one or more components of the vapor delivery system 100 and the showerhead 108, among other examples.

A valve 128-1 may be located between the plasma source 114 and the showerhead 108 and may regulate, block, permit, and/or otherwise control the flow of plasma (or plasma precursors) from the plasma source 114 to the showerhead 108. The valve 128-2 may be located between the manifold 112d and the showerhead 108 and may regulate, block, permit, and/or otherwise control the flow of purge gasses to the showerhead 108. The valve 128-3 may be located between the manifold 112d and the PVM 116 and may regulate, block, permit, and/or otherwise control the flow of purge gasses to the PVM 116. The valve 128-4 may be located between the manifold 112a and the PVM 116 and may regulate, block, permit, and/or otherwise control the flow of co-reactant gasses to the PVM 116. The valve 128-5 may be located between the manifold 112b and the HIM 118 and may regulate, block, permit, and/or otherwise control the flow of carrier gasses to the HIM 118. The valve 128-6 may be located between the carrier gas source 124 and the ampoule 120 and may regulate, block, permit, and/or otherwise control the flow of carrier gasses to the ampoule 120. The valve 128-7 may be located between the bulk storage container 126 and the ampoule 120 and may regulate, block, permit, and/or otherwise control the flow of liquid precursors to the ampoule 120. The valve 128-8 may be located between the ampoule 120 and the HIM 118 and may regulate, block, permit, and/or otherwise control the flow of vaporized precursors to the HIM 118.

As shown in FIG. 1, the PVM 116 includes a plurality of valves, including the valves 128-9 through 128-12. The valve 128-9 may regulate, block, permit, and/or otherwise control the flow of a heated mixture of vaporized precursors and carrier gasses from the HIM 118 to the PVM 116. The valve 128-10 may regulate, block, permit, and/or otherwise control the flow of co-reactant gasses from the manifold 112a to the PVM 116, the flow purge gasses from the manifold 112d to the PVM 116, or a mixture thereof. The valve 128-11 may regulate, block, permit, and/or otherwise control the flow of gasses from the manifold 112c to the PVM 116.

The valve 128-12 may regulate, block, permit, and/or otherwise control the flow of gasses from the PVM 116 to a diverter 130, which may be in fluid communication with a vacuum pump that is configured to evacuate gasses from the PVM 116. Similarly, the valve 128-13 may regulate, block, permit, and/or otherwise control the flow of gasses from the manifold 112c to another diverter 130, which may be in fluid communication with a vacuum pump that is configured to evacuate gasses from the manifold 112c.

As further shown in FIG. 1, the vapor delivery system 100 includes a controller 132, which may take the form of a processor. The controller 132 is configured to be communicatively connected with one or more components of the vapor delivery system 100 and one or more components of the deposition tool 102 over wired and/or wireless connections. The controller 132 may communicate with one or more components of the vapor delivery system 100 and one or more components of the deposition tool 102 to initiate operation of the vapor delivery system 100 and/or the deposition tool 102, to terminate operation of the vapor delivery system 100 and/or the deposition tool 102, to receive signals and/or information from one or more components of the vapor delivery system 100 and/or one or more components of the deposition tool 102, and/or to transmit signals to cause one or more components of the vapor delivery system 100 and/or one or more components of the deposition tool 102 to perform one or more actions, among other examples. The controller 132 is further configured to receive sensor data from one or more of the valves 128-1 through 128-13 to monitor various operational aspects of the valves 128-1 through 128-13, as described in greater detail herein.

As indicated above, FIG. 1 is provided as an example. Other examples may differ from what is described with regard to FIG. 1. For example, vapor delivery system 100 may include additional components, fewer components, different components, or differently arranged components than those shown in FIG. 1.

Figure 2:
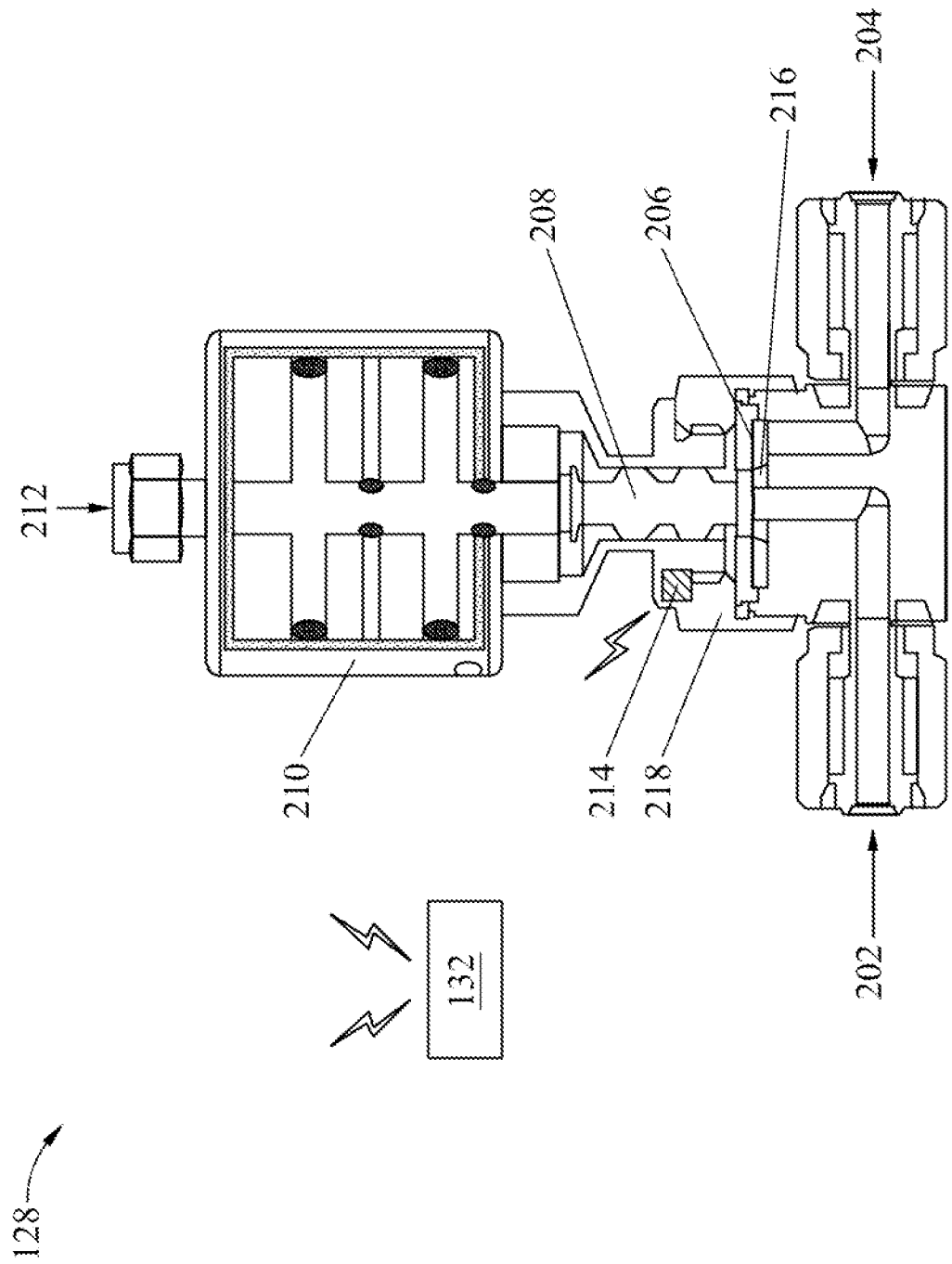
FIG. 2 is a diagram of an example valve described herein for use in the vapor delivery system of FIG. 1.

FIG. 2 is a diagram of an example valve 128 described herein for use in the vapor delivery system 100 of FIG. 1. The valve 128 may include an ALD valve or a valve included in a vapor delivery system for another type of deposition tool 102. The valve 128 is configured to regulate, block, permit, and/or otherwise control the flow of a processing fluid through the valve 128. The processing fluid may include a purge gas, a carrier gas, a liquid precursor, a vaporized precursor, a plasma precursor, or a combination thereof.

As shown in FIG. 2, the valve 128 includes a fluid inlet 202 configured to receive a processing fluid from another component of the vapor delivery system 100, and a fluid outlet 204 configured to provide the processing fluid to another component of the vapor delivery system 100 or to the showerhead 108 of the deposition tool 102. The valve 128 includes a diaphragm 206 that is configured to selectively block or open a fluid path between the fluid inlet 202 and the fluid outlet 204 in the valve 128. The diaphragm 206 includes a flexible and substantially planar component that is capable of deforming to selectively block or open the fluid path between the fluid inlet 202 and the fluid outlet 204 in the valve 128. The diaphragm 206 may be approximately circle-shaped, oval-shaped, square-shaped, or may conform to another polygonal shape. In some implementations, the valve 128 includes a discrete valve in which the diaphragm 206 is configured to selectively operate in one of two configurations: a closed configuration and an open configuration. In the closed configuration, the diaphragm 206 blocks the fluid path between the fluid inlet 202 and the fluid outlet 204. In the open configuration, the diaphragm 206 opens the fluid path between the fluid inlet 202 and the fluid outlet 204 such that the processing fluid is permitted to flow from the fluid inlet 202 to the fluid outlet 204. In some implementations, the valve 128 includes a variable valve in which the diaphragm 206 is configured to operate in a range of configurations between the open configuration and the closed configuration, which may permit more flexible control over the flow of the fluid by permitting variable amounts of the flow between full flow and no flow.

The diaphragm 206 is operated by a valve stem 208 included in the valve 128. The valve stem 208 includes an elongated member that extends between the diaphragm 206 and a piston 210 of the valve 128. The valve stem 208 may translate along a vertical direction, along a horizontal direction, or in another direction to selectively deform the diaphragm 206 or to return the diaphragm 206 to a non-deformed position. The valve stem 208 may be located above and/or over the diaphragm 206. The piston 210 may be located above, over, and/or around the valve stem 208. In some implementations, a spring (not shown) is included in the valve 128 to bias the valve stem 208 against the diaphragm 206 such that the diaphragm 206 is biased in the closed configuration.

The piston 210 is actuated (e.g., to translate the valve stem 208) by a pressurized gas that is provided into the valve 128 through a control inlet 212. In these implementations, the valve 128 includes a pneumatically controlled valve. The pressurized gas may include a clean dry air (CDA), an extra CDA (XCDA), or another type of pressurized gas. The pressurized gas causes the piston to rise in the valve 128, which pulls the valve stem 208 upward (e.g., against the pressure of the spring). The upward movement of the valve stem 208 causes the diaphragm 206 to deform such that the flow path between the fluid inlet 202 and the fluid outlet 204 is opened. The fluid path may be closed by removing the pressurized gas input to the control inlet 212. This causes the spring to pull the piston 210 and the valve stem 208 downward such that the diaphragm 206 is returned to the non-deformed (closed) configuration. In some implementations, the piston 210 is actuated by other type of input including a mechanical input.

As further shown in FIG. 2, the valve 128 includes a sensor 214. The sensor 214 is located proximate to the diaphragm 206 and is configured to generate sensor data associated with the diaphragm 206. Examples of the sensor 214 include a laser sensor, an infrared sensor, a radar sensor, a time of flight (ToF) sensor, a proximity sensor, a Hall effect sensor, or an ultrasound sensor, among other examples. The sensor 214 may provide or transmit the sensor data to the controller 132 such that the controller 132 may use the sensor data to determine a position or configuration of the diaphragm 206, to monitor the operation of the diaphragm 206, to determine or detect failures associated with the diaphragm 206, and/or to cause one or more components of the vapor delivery system 100 and/or one or more components of the deposition tool 102 to perform one or more actions based on the determination or detection of a failure associated with the diaphragm 206, among other examples.

In some implementations, the sensor 214 is configured as a distance sensor that is configured to generate sensor data based on a distance between the sensor 214 and the diaphragm 206. The distance between the sensor 214 and the diaphragm 206 may change based on the position of the diaphragm 206. In particular, the distance between the sensor 214 and the diaphragm 206 may decrease as the deformation of the diaphragm 206 increases, and may increase as the deformation of the diaphragm 206 decreases. The distance between the sensor 214 and the diaphragm 206 may be the greatest when the diaphragm 206 is in a closed configuration in which the diaphragm 206 is biased against a valve seat 216. The diaphragm being biased against the valve seat 216 blocks the flow path between the fluid inlet 202 and the fluid outlet 204. The distance between the sensor 214 and the diaphragm 206 may decrease as the position of the diaphragm 206 is separated from the valve seat 216, and may be the smallest when the diaphragm 206 is fully deformed and in the open configuration.

The sensor 214 is included in a housing 218 of the valve 128. The housing 218 may include a lower housing of the valve 128 in which the diaphragm 206 is located, which may be separate from an upper housing in which the piston 210 is located. Alternatively, the housing 218 may include a single housing, and the sensor 214 is located in a lower portion of the housing 218. The sensor 214 is located between the piston 210 and the diaphragm 206 in the housing 218 such that the piston 210 does not obstruct the sensing path between the sensor 214 and the diaphragm 206. Moreover, the sensor 214 is located adjacent to the valve stem 208 such that the valve stem 208 does not obstruct the sensing path between the sensor 214 and the diaphragm 206. The sensor 214 may be located a distance away from the diaphragm 206 such that the diaphragm 206 does not physically contact the sensor 214 when the diaphragm 206 is fully deformed in the open configuration.

As indicated above, FIG. 2 is provided as an example. Other examples may differ from what is described with regard to FIG. 2.

Figure 3:
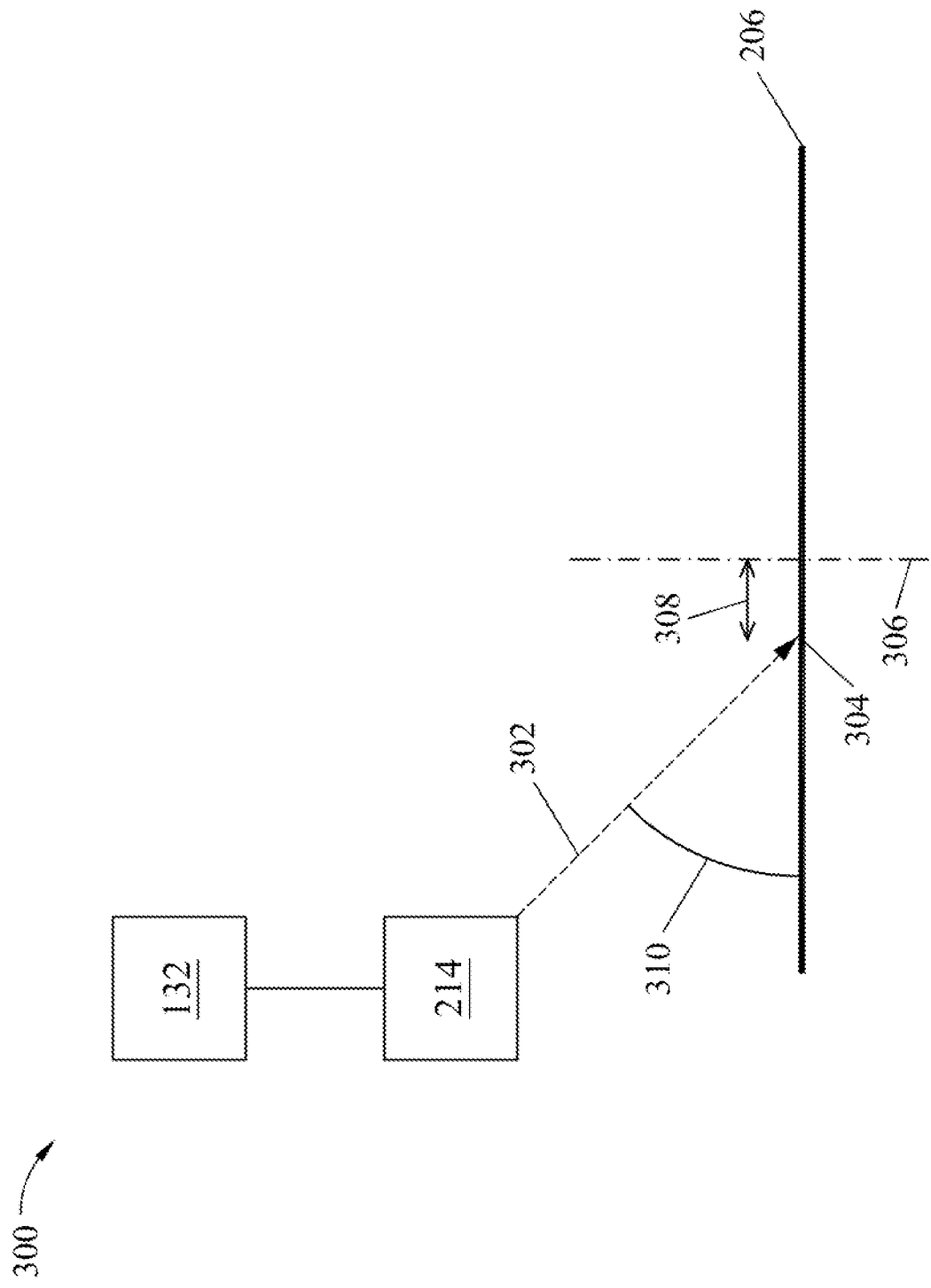
FIGS. 3, 4, 5A, and 5B, 6, and 7A-7C are diagrams of example implementations described herein.

FIG. 3 is a diagram of an example implementation 300 described herein. The example implementation 300 includes an example of the sensor 214 transmitting a measurement signal 302 toward, at, and/or onto the diaphragm 206.

The sensor 214 transmits (or emits) the measurement signal 302 to generate sensor data based on a reflection of the measurement signal 302. The measurement signal 302 includes a distance measurement signal, an angle measurement signal, and/or another type of measurement signal. The measurement signal 302 may include a laser signal, a radar signal, an electromagnetic field signal, an infrared signal, a magnetic field signal, or another type of signal. The sensor 214 is configured to transmit or emit the measurement signal 302 toward or onto the diaphragm 206 at or near a measurement point 304 on the diaphragm 206. The measurement point 304 is located away from a center 306 of the diaphragm 206 such that the valve stem 208 (which interfaces with the diaphragm 206 at or near the center 306 of the diaphragm 206) does not interfere with the measurement signal 302 and generation of sensor data. The distance between the measurement point 304 and the center 306 may correspond to an offset 308, which may be greater than the radius of the valve stem 208 and less than the radius of the diaphragm 206.

Moreover, the sensor 214 may be located in the housing 218 of the valve 128 above the diaphragm 206 and adjacent to the valve stem 208 such that the sensor 214 transmits the measurement signal 302 onto the measurement point 304 at an angle of incidence 310 relative to the top surface of the diaphragm 206. The angle of incidence 310 may be in a range of approximately 30 degrees to approximately 75 degrees to minimize or prevent the interference of the measurement signal 302 by the valve stem 208 and to minimize or prevent the interference of the sensor 214 with the operation of the piston 210. However, other values for the angle of incidence 310 are within the scope of the present disclosure.

As indicated above, FIG. 3 is provided as an example. Other examples may differ from what is described with regard to FIG. 3.

Figure 4:
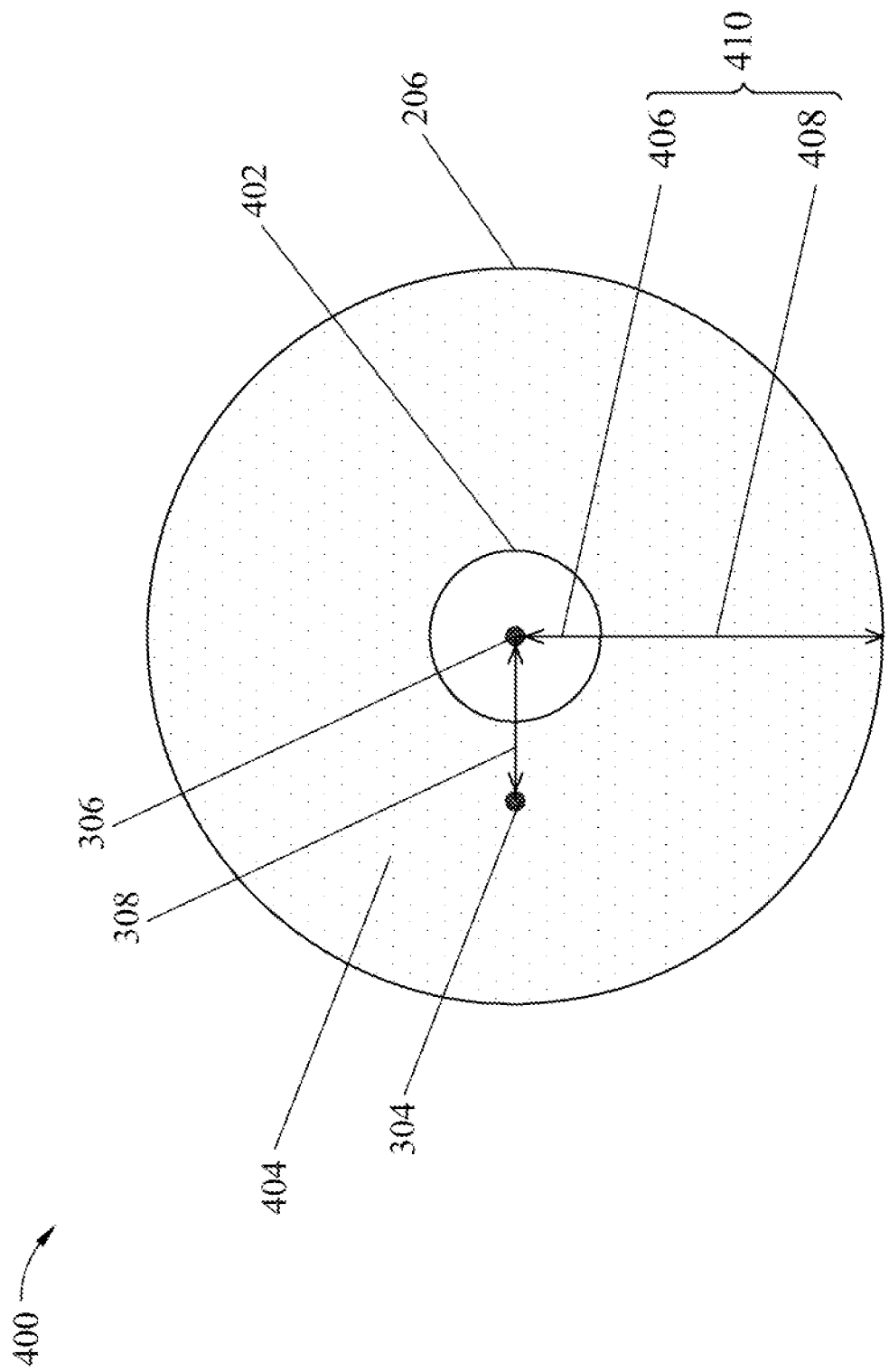

FIG. 4 is a diagram of an example implementation 400 described herein. The example implementation 400 includes an example of the diaphragm 206. FIG. 4 illustrates a top-down view of the diaphragm 206.

As shown in FIG. 4, the diaphragm 206 includes an approximately round or circular shape. However, the diaphragm 206 may include another shape. As further shown in FIG. 4, the diaphragm 206 includes an inner region 402 and an outer region 404 that surrounds the inner region 402. The inner region 402 interfaces with the valve stem 208 of the valve 128 and includes the center 306 of the diaphragm 206. In particular, the inner region 402 includes a region of the diaphragm 206 in which the valve stem 208 actuates the diaphragm 206 to selectively deform the diaphragm 206 or to return the diaphragm 206 to a non-deformed position. The outer region 404 includes a region of the diaphragm 206 in which the sensor 214 transmits or emits the measurement signal 302 onto the diaphragm 206.

As further shown in FIG. 4, the outer region 404 includes a greater surface area of the diaphragm 206 relative to the inner region 402. Moreover, a radius 406 of the inner region 402 is less than a width 408 of the outer region 404. In some implementations, a ratio of the radius 406 of the inner region 402 to a radius 410 of the diaphragm 206 (which includes a combination of the radius 406 and the width 408) is in a range of greater than 0 to approximately 0.2, which corresponds to the area occupied by the valve stem 208. In some implementations, a ratio of the width 408 of the outer region 404 to the radius 410 of the diaphragm 206 is in a range of approximately 0.2 to approximately 1, such that the measurement point 304 is located outside of the area occupied by the valve stem 208.

As indicated above, FIG. 4 is provided as an example. Other examples may differ from what is described with regard to FIG. 4.

Figure 5A:
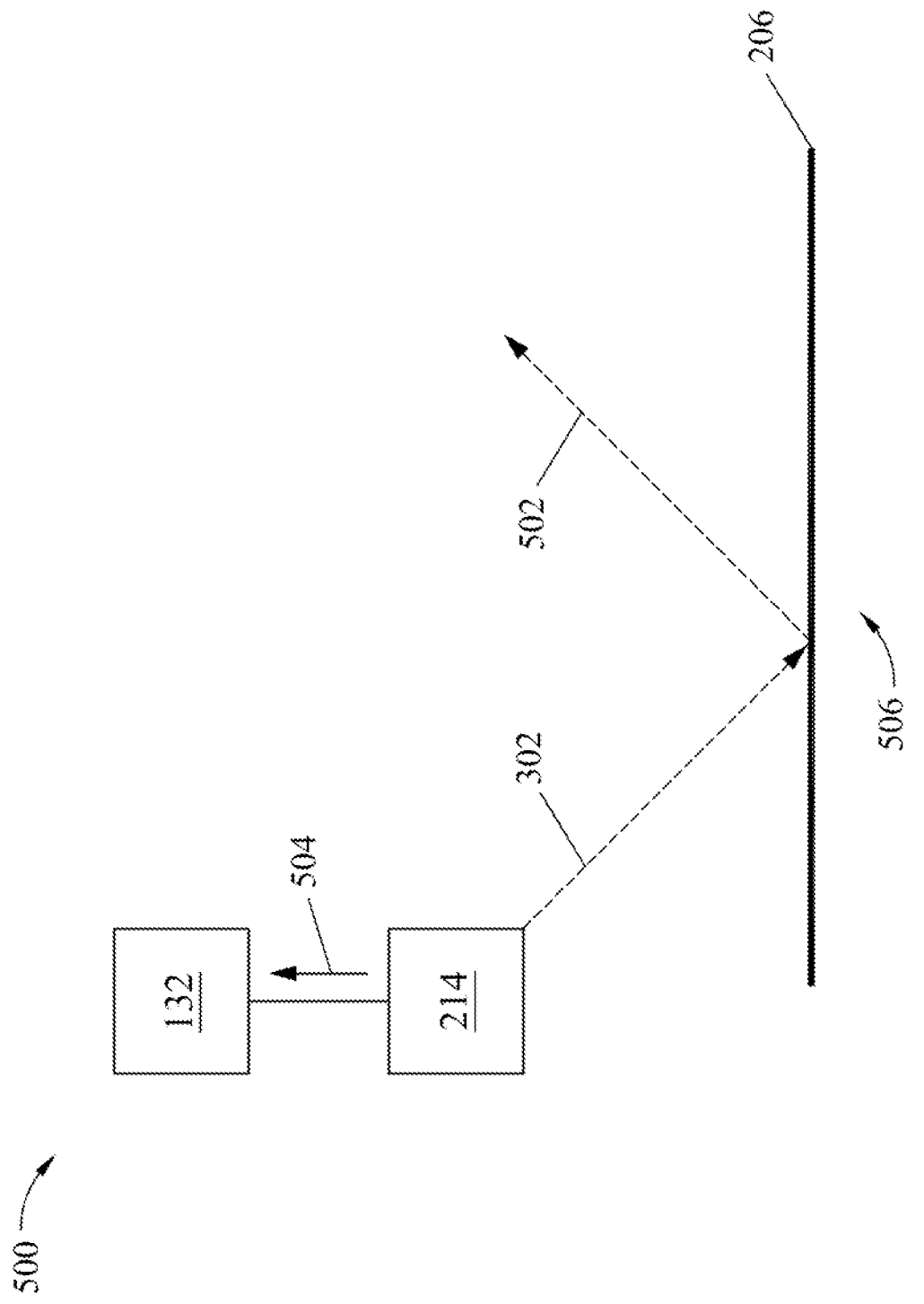
Figure 5B:
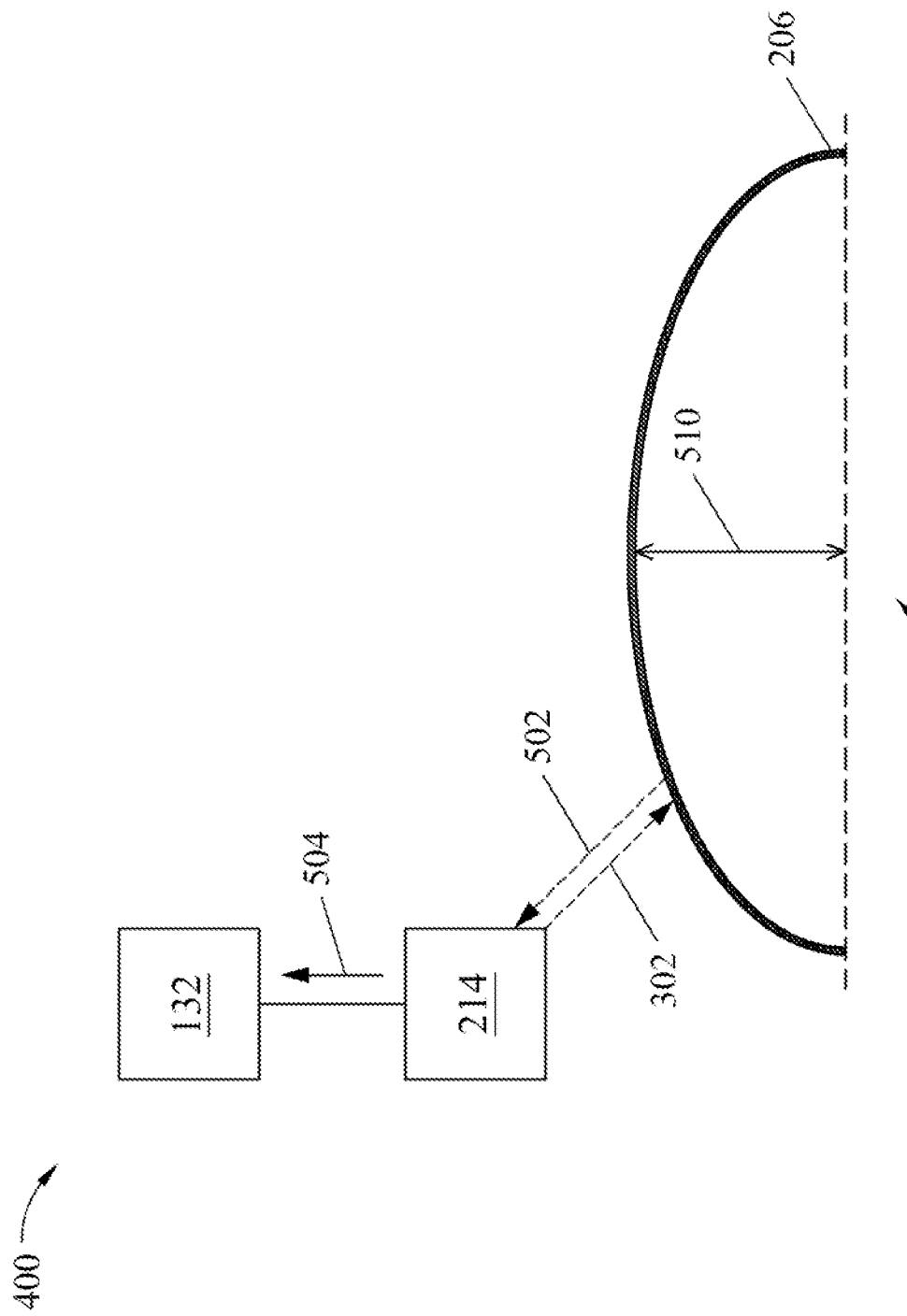

FIGS. 5A and 5B are diagrams of an example implementation 500 described herein. The example implementation 500 includes an example of a plurality of configurations of the diaphragm 206. As shown in FIGS. 5A and 5B, the sensor 214 may transmit the measurement signal 302 onto the diaphragm 206 in the plurality of configurations. The measurement signal 302 is reflected off of the surface of the diaphragm 206, which corresponds to a reflected signal 502 (e.g., a reflected distance measurement signal, a reflected proximity detection signal, or another type of reflected signal).

As further shown in FIGS. 5A and 5B, the sensor 214 generates and provides sensor data 504 to the controller 132. The sensor data 504 includes a voltage, a current, a resistance, an inductance, a digital signal or communication, or another type of sensor data. The sensor 214 generates the sensor data 504 based on an intensity of the reflected signal 502 received at the sensor 214. The intensity of the reflected signal 502 is based on a distance between the sensor 214 and the diaphragm 206, an angle of the diaphragm 206 relative to the sensor 214, a position or configuration of the diaphragm 206, an amount of displacement or deformation of the diaphragm 206, and/or is based on another parameter or attribute.

FIG. 5A illustrates a closed configuration 506 of the diaphragm 206. As shown in FIG. 5A, the diaphragm 206 is approximately flat and in a non-deformed position. In the closed configuration 506, the diaphragm 206 is biased against the valve seat 216 such that the flow path between the fluid inlet 202 and the fluid outlet 204 is blocked by the diaphragm 206.

As further shown in FIG. 5A, the measurement signal 302 is reflected off of the surface of the diaphragm 206 such that the reflected signal 502 is directed away from the sensor 214. Accordingly, the signal intensity of the reflected signal 502 received at the sensor 214 is low. As an example, the signal intensity of the reflected signal 502 received at the sensor 214 may be in a range of approximately 0% to approximately 0.3% of the signal intensity of the measurement signal 302 when the diaphragm 206 is in the closed configuration 506. However, other values for the signal intensity of the reflected signal 502 received at the sensor 214 when the diaphragm 206 is in the closed configuration 506 are within the scope of the present disclosure.

FIG. 5B illustrates an open configuration 508 of the diaphragm 206. As shown in FIG. 5B, the diaphragm 206 is in a deformed or curved. In the open configuration 508, the diaphragm 206 is positioned away from the plane of the diaphragm 206 when the diaphragm 206 is in the closed configuration 506 by a distance 510 (which may be referred to as the deformation distance). In the open configuration 508, the diaphragm 206 is forced off and away from the valve seat 216 (e.g., by the valve stem 208) such that the flow path between the fluid inlet 202 and the fluid outlet 204 is open.

As further shown in FIG. 5B, the measurement signal 302 is reflected off of the surface of the diaphragm 206 and back toward the sensor 214 such that the reflected signal 502 is received at the sensor 214. Accordingly, the signal intensity of the reflected signal 502 received at the sensor 214 is high (and greater than when the diaphragm 206 is in the closed configuration 506). As an example, the signal intensity of the reflected signal 502 received at the sensor 214 may be in a range of approximately 99% to approximately 100% of the signal intensity of the measurement signal 302 when the diaphragm 206 is in the open configuration 508. However, other values for the signal intensity of the reflected signal 502 received at the sensor 214 when the diaphragm 206 is in the open configuration 508 are within the scope of the present disclosure. In some implementations, a ratio of the distance 510 (e.g., the deformation distance) and the radius 410 of the diaphragm 206 is in a range of approximately 0.3 to approximately 0.5 when the diaphragm 206 is in the open configuration 508.

The signal intensity of the reflected signal 502 received at the sensor 214 may range from approximately 0% to approximately 100% across the range of deformation of the diaphragm 206, where the signal intensity is lowest when the diaphragm 206 is in the closed configuration 506 and highest with the diaphragm 206 is in the open configuration 508. The signal intensity of the reflected signal 502 received at the sensor 214 may depend on the position of the diaphragm 206 (e.g., the position of the center 306 of the diaphragm 206), the location of the measurement point 304, the angle of the surface of the diaphragm 206 relative to the angle of the measurement signal 302, the distance 510, and/or other parameters.

The controller 132 may receive the sensor data 504 from the sensor 214. The controller 132 may determine, based on the sensor data 504, one or more parameters associated with the diaphragm 206. Examples of parameters include a position of the diaphragm 206, an amount of displacement (e.g., the distance 510) of the diaphragm 206, and/or a configuration that the diaphragm 206 is in (e.g., the closed configuration 506, the open configuration 508), among other examples. In particular, the sensor 214 may determine the one or more parameters based on the signal intensity of the reflected signal 502 indicated by the sensor data 504. In some implementations, the sensor 214 determines the one or more parameters based on the relationship between the signal intensity and the distance 510, the configuration of the diaphragm 206, and/or the angle of the surface of the diaphragm 206 relative to the sensor 214 described above.

In some implementations, the controller 132 determines the flow of processing fluid through the valve 128 and/or an operational status of the diaphragm 206 based on the signal intensity of the reflected signal 502 indicated by the sensor data 504. For example, the controller 132 may determine whether the diaphragm 206 is in proper working operation, may detect a failure of the diaphragm 206, and/or may detect abnormal operation of the diaphragm 206, among other examples. In some implementations, the controller 132 may determine an estimated position or configuration of the diaphragm 206 based on the sensor data 504, may compare the estimated position or configuration and a position or configuration setting for the diaphragm 206, and may determine that the estimated position or configuration of the diaphragm 206 deviates from the position or configuration setting for the diaphragm 206 based on a result of the comparison. As an example, the controller 132 may determine that a failure of the diaphragm 206 has occurred based on determining that the diaphragm 206 is in the closed configuration 506 when the setting for the diaphragm 206 is the open configuration 508. This type of failure may correspond to an unopened failure, or a failure of the diaphragm 206 to open, which can cause the diaphragm 206 to at least partially block the flow between the fluid inlet 202 and the fluid outlet 204 of the valve 128. An unopened failure may be caused, for example, by material fatigue where the diaphragm 206 rips or tears or where the valve stem 208 detaches from the diaphragm 206, among other examples.

In some implementations, an unopened failure may occur due to precursor condensation on the diaphragm 206 or an impurity blockage. In these implementations, the controller 132 may determine, based on the sensor data 504, that the diaphragm 206 is reading as being in the opened configuration 508 when the setting for diaphragm 206 is the closed configuration 506. This may occur, for example, when the precursor condensation or the impurity blockage prevents the diaphragm 206 from being seated against the valve seat 216 and instead is stuck in the open configuration 508 because the precursor condensation or the impurity blockage has built up onto the valve seat 216 (which blocks the flow path and prevents the diaphragm 206 from being seated against the valve seat 216).

In some implementations, the controller 132 may determine that a failure of the diaphragm 206 has occurred based on determining that the signal intensity of the reflected signal 502 does not satisfy a threshold signal intensity (e.g., is equal to or less than 0.3% or another threshold signal intensity), where the signal intensity not satisfying the threshold signal intensity is indicative of the position of the diaphragm 206 being in a closed position or the closed configuration 506. In some implementations, the controller 132 may determine that a failure of the diaphragm 206 has occurred based on determining that the signal intensity of the reflected signal 502 does not satisfy a threshold signal intensity (e.g., is equal to or less than 80% or another threshold signal intensity), where the signal intensity not satisfying the threshold signal intensity is indicative of a failure of the diaphragm 206 to fully open to the open configuration 508. This can result in a decreased flow of processing fluid through the valve 128. The decreased flow may result in surface non-uniformities and/or decreased layer thickness of a layer formed on a semiconductor substrate by the deposition tool 102.

In some implementations, the controller 132 includes a flow analyzer, a flow counter, or another type of flow monitoring device that is capable of monitoring and/or analyzing the flow of processing fluid through the valve 128 based on the sensor data 504 received from the sensor 214. In these implementations, the controller 132 may perform a flow analysis of the flow of the processing fluid through the valve 128 (which may include an ALD precursor, a purge gas, or another type of fluid) based on the signal intensity of the reflected signal 502 indicated by the sensor data 504. In particular, the controller 132 may analyze the signal intensity over time during a deposition operation (e.g., an ALD operation) of the deposition tool 102. The controller 132 may analyze the signal intensity to count the number of open and close operations of the diaphragm 206 during the deposition operation, to determine whether the diaphragm 206 is fully opening and/or fully closing during the deposition operation, and/or to analyze other operational aspects of the diaphragm 206 during the deposition operation.

Based on the quantity of open and close operations, whether the diaphragm 206 is fully opening and/or fully closing, and/or the other operation aspects of the diaphragm 206, the controller 132 may determine a "real flow" or an estimated actual flow of the processing fluid through the valve 128. The controller 132 may then determine, based on the estimated actual flow, whether the estimated actual flow satisfies a threshold flow (e.g., flow rate setting or parameter) for the rate for the deposition operation. The controller 132 may determine an estimated deposition thickness and/or an estimated deposition uniformity of a layer that is to be formed on a semiconductor substrate in the deposition operation, and may determine whether the estimated deposition thickness satisfies a deposition thickness parameter for the deposition operation.

In some implementations, the controller 132 uses machine learning to estimate whether the flow rate of the processing fluid through the valve 128 will result in poor deposition thickness and/or poor deposition uniformity, among other deposition parameters. In these implementations, the controller 132 may train a machine learning model on a plurality of historical deposition operations (e.g., thousands of historical deposition operations, tens of thousands of historical deposition operations, hundreds of thousands of historical deposition operations, and/or another quantity). The controller 132 may then provide the estimated actual flow of the processing fluid through the valve 128 (which is determined based on the sensor data 504) as input to the machine learning model such that the controller 132 uses the machine learning model to estimate or predict an outcome of the deposition operation in real time or near real time. In this way, the controller 132 may use the machine learning model to determine, estimate, and/or predict whether a deposition operation will be successful such that the controller 132 may quickly abort or terminate an abnormal deposition operation before a large amount of semiconductor substrates need to be scrapped due to the abnormal deposition operation.

As indicated above, FIGS. 5A and 5B are provided as examples. Other examples may differ from what is described with regard to FIGS. 5A and 5B.

Figure 6:
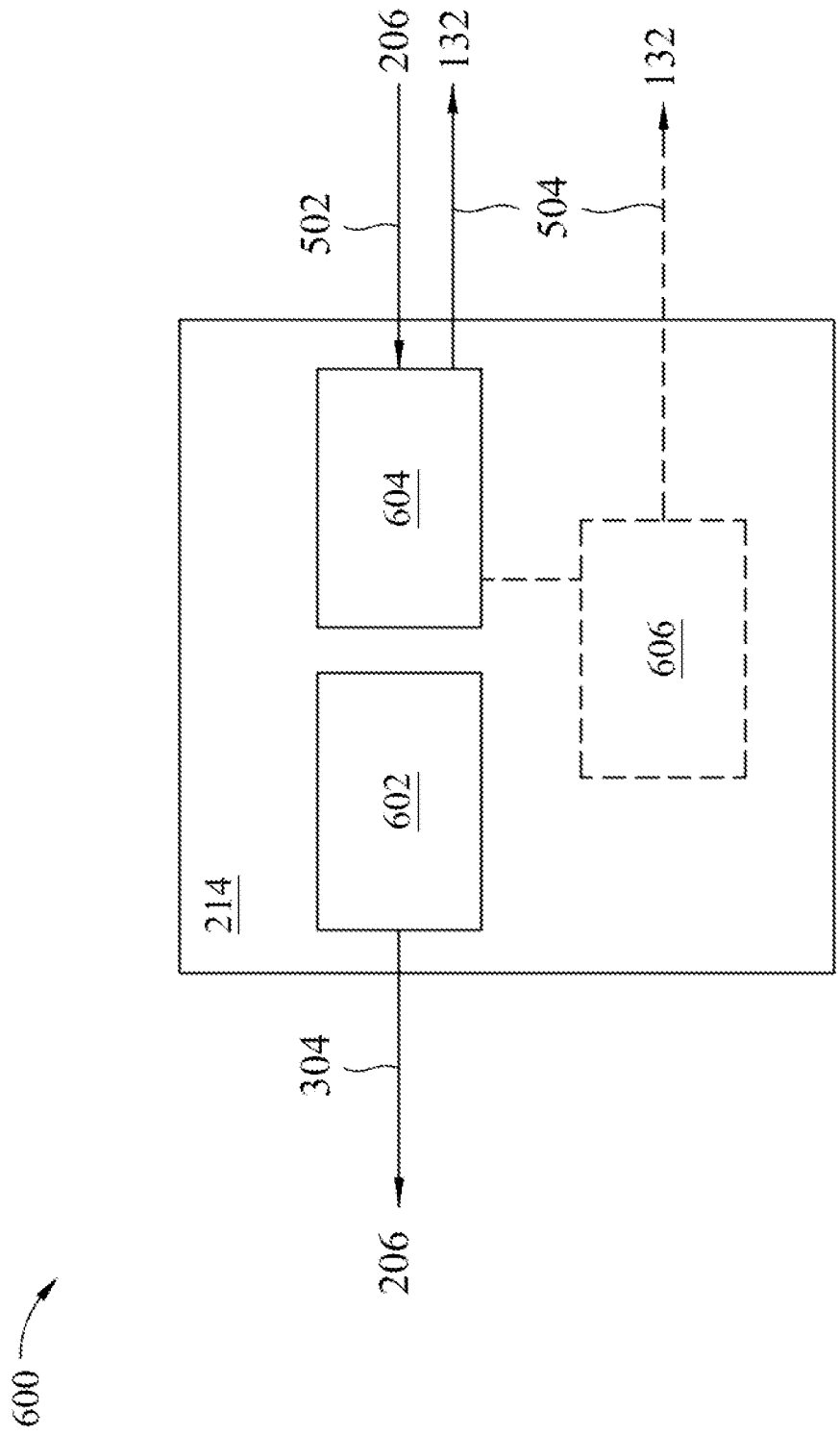

FIG. 6 is a diagram of an example implementation 600 described herein. The example implementation 600 includes an example of the sensor 214 for use in a valve 128 of the vapor delivery system 100 of FIG. 1. As shown in FIG. 6, the sensor 214 includes a plurality of components, such as a signal generator 602, a signal detector 604, and a communication interface 606, among other components.

As shown in FIG. 6, the signal generator 602 is configured to generate and to transmit or emit the measurement signal 302 (e.g., a distance measurement signal or another type of measurement signal) toward, at, and/or onto the diaphragm 206. The signal detector 604 is configured to detect the reflected signal 502 from the diaphragm 206. Moreover, the signal detector 604 is configured to generate the sensor data 504 based on the reflected signal 502 received from the diaphragm 206.

In some implementations, the signal detector 604 is configured to provide the sensor data 504 directly to the controller 132 (e.g., over wires, circuit board traces, conductive leads). In these implementations, the sensor data 504 includes an analog signal such as a voltage or a current. In some implementations, the sensor 214 includes the communication interface 606, which may include a wired or wireless communication interface. In these implementations, the sensor 214 is configured to convert the signal intensity from the reflected signal 502 from an analog signal to a digital signal or a digital measurement of the signal intensity, and the communication interface 606 is configured to transmit the digital signal or a digital measurement in a wired or wireless communication to the controller 132.

As indicated above, FIG. 6 is provided as an example. Other examples may differ from what is described with regard to FIG. 6.

Figure 7A:
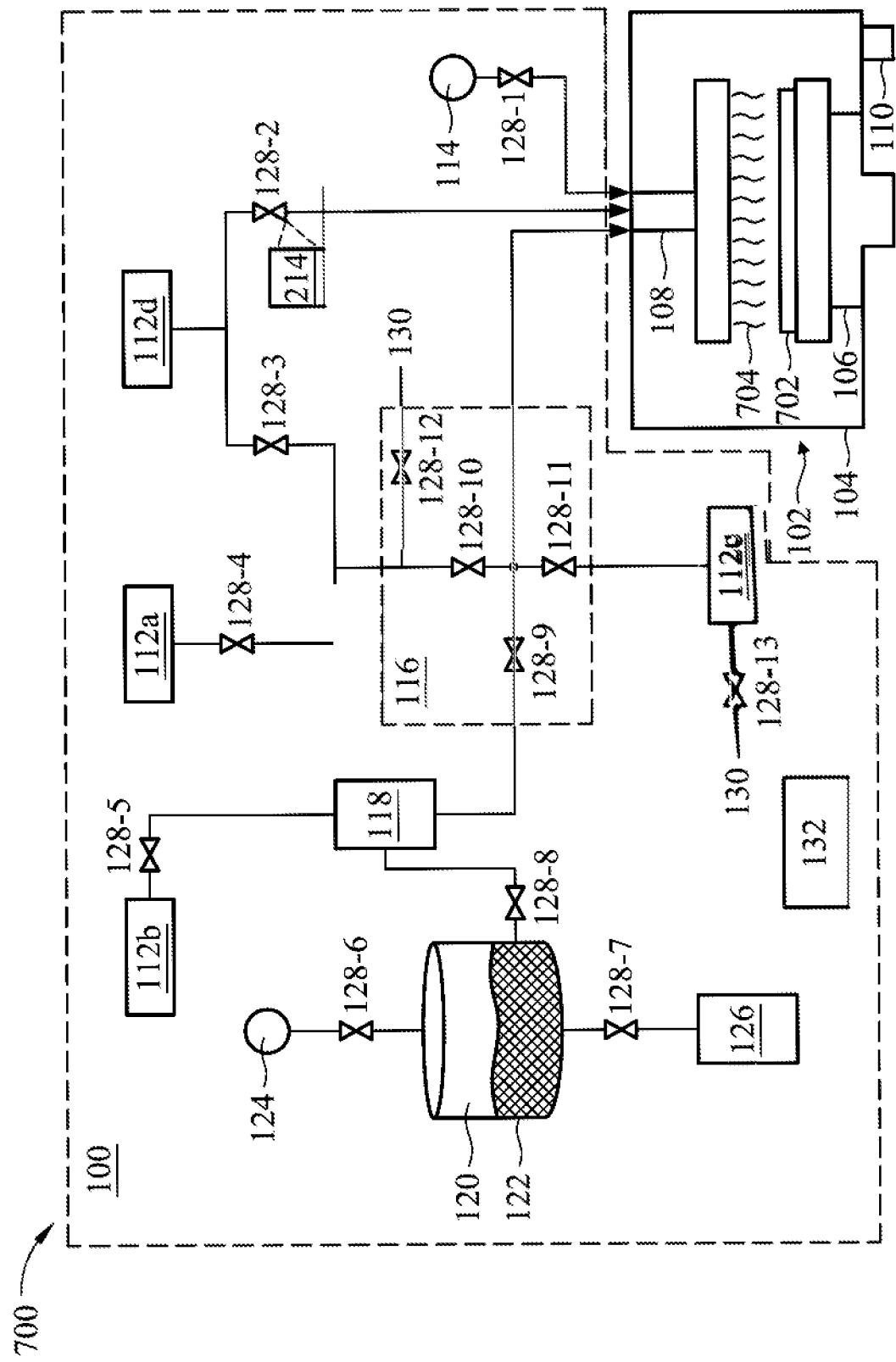
Figure 7B:
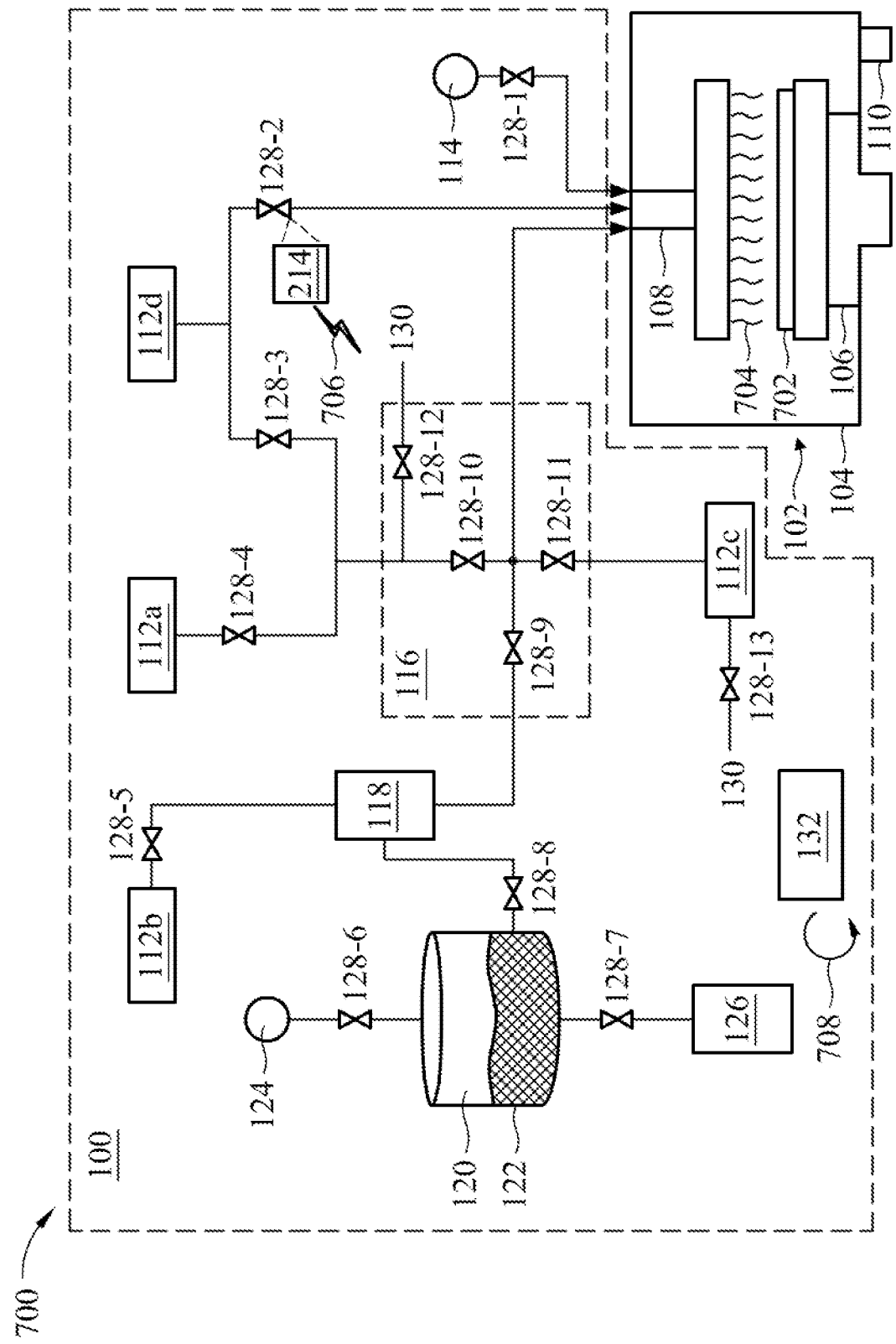
Figure 7C:
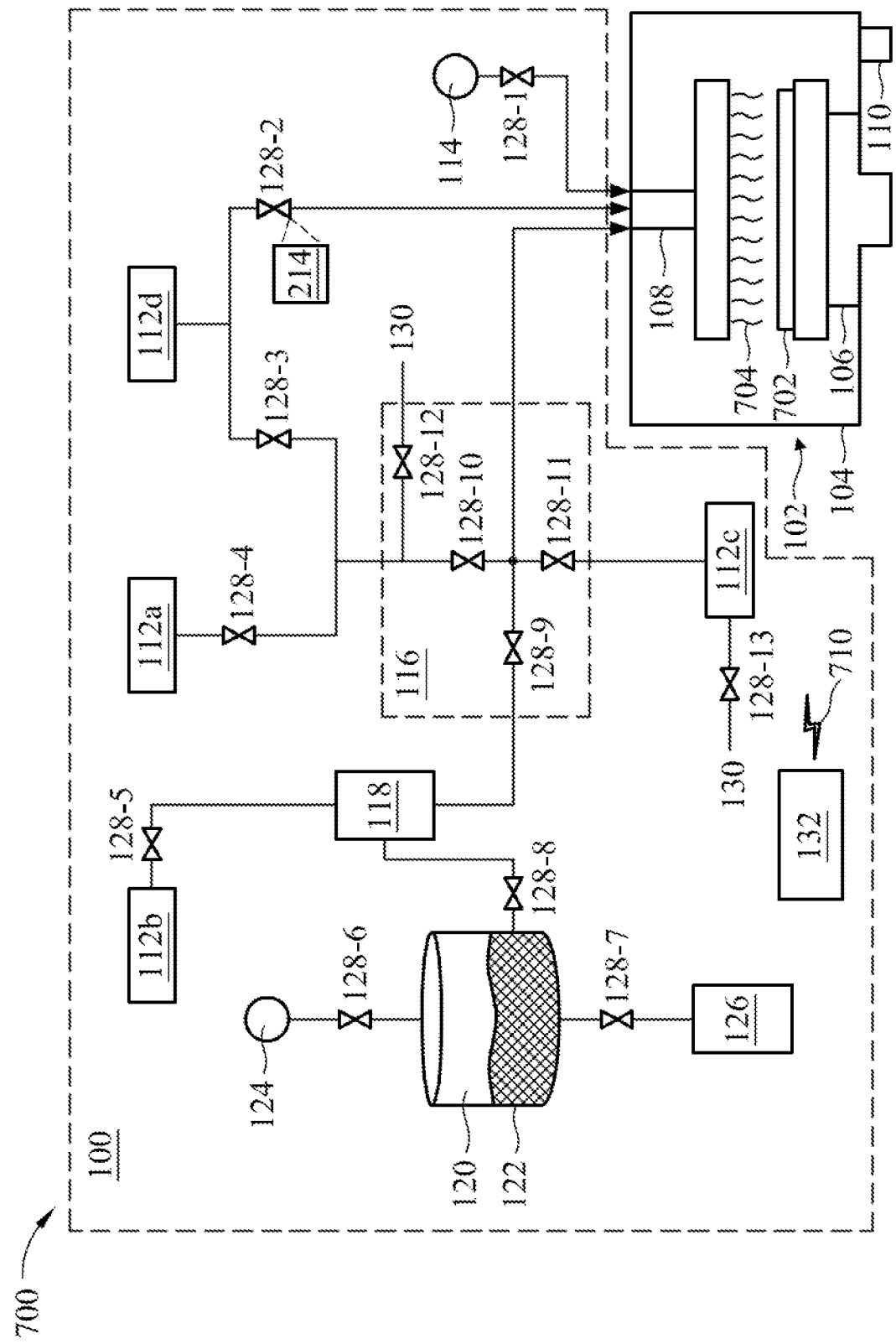

FIGS. 7A-7C are diagrams of an example implementation 700 described herein. The example implementation 700 includes an example of detecting a failure of the diaphragm 206 during a deposition operation. As shown in FIG. 7A, the deposition operation may include an ALD operation or another type of deposition operation in which a layer is formed on a semiconductor substrate 702. In the deposition operation, the vapor delivery system 100 provides or supplies one or more precursors 704 (e.g., ALD precursor(s)) to the showerhead 108 of the deposition tool 102, which provides the one or more precursors into the processing chamber 104 of the deposition tool 102 to form a layer on the semiconductor substrate 702. As further shown in FIG. 7A, a valve (e.g., the valve 128-2) in the vapor delivery system 100 may include a sensor 214.

As shown in FIG. 7B, and by reference number 706, the sensor 214 provides sensor data 706 (e.g., which may include the sensor data 504 generated by the sensor 214) to the controller 132. In some implementations, the sensor 214 continuously generates the sensor data 706 throughout the deposition operation and streams the sensor data 706 to the controller 132.

As further shown in FIG. 7B, and by reference number 708, the controller 132 determines a position of the diaphragm 206 of the valve 128-2 based on the sensor data 706 received from the sensor 214. For example, the controller 132 may determine the position of the diaphragm 206 using one or more techniques described herein. In some implementations, the controller 132 further determines an estimated flow rate of processing fluid (e.g., ALD precursors) through the valve 128-2 based on the sensor data 706, as described herein.

The controller 132 may determine, based on the position of the diaphragm 206 and/or based on the estimated flow rate, that the flow of the processing fluid through the valve 128-2 is at least partially blocked by the diaphragm 206. For example, the controller 132 may determine that the flow of the processing fluid through the valve 128-2 is at least partially blocked by the diaphragm 206 using one or more techniques described herein.

As shown in FIG. 7C, and by reference number 710, the controller 132 may transmit one or more signals 710 to one or more components included in the vapor delivery system 100 and/or to one or more components included in the deposition tool 102. In particular, the controller 132 transmits the one or more signals 710 based on determining that the flow of the processing fluid through the valve 128-2 is at least partially blocked by the diaphragm 206.

In some implementations, the controller 132 transmits a signal 710 to one or more components included in the vapor delivery system 100 and/or to one or more components included in the deposition tool 102 to cause the deposition operation to be terminated, aborted, and/or otherwise stopped. In some implementations, this may enable this vapor delivery system 100 to cause the ALD operation to be stopped before a greater quantity than 1 semiconductor substrate is scrapped. In some implementations, the controller 132 transmits a signal 710 to one or more components included in the vapor delivery system 100 and/or to one or more components included in the deposition tool 102 to cause the flow rate of the processing fluid to be adjusted (e.g., increased) based on the blockage in the valve 128-2. In some implementations, the controller 132 transmits a signal 710 to one or more components included in the vapor delivery system 100 and/or to one or more components included in the deposition tool 102 to cause the flow rate of one or more other processing fluids to be adjusted (e.g., to be decreased) based on the blockage in the valve 128-2. In this way, the flow rate of one or more other processing fluids may be adjusted to maintain the mixture of precursors in the vapor delivery system 100 at or near a concentration parameter for the deposition operation.

As indicated above, FIGS. 7A-7C are provided as an example. Other examples may differ from what is described with regard to FIGS. 7A-7C. Moreover, while the operations and techniques of FIGS. 7A-7C are described in connection with the valve 128-2, the operations and techniques of FIGS. 7A-7C may be performed in connection with other valves of the vapor delivery system 100, including one or more of the valves 128-1 through 128-13.

Figure 8:
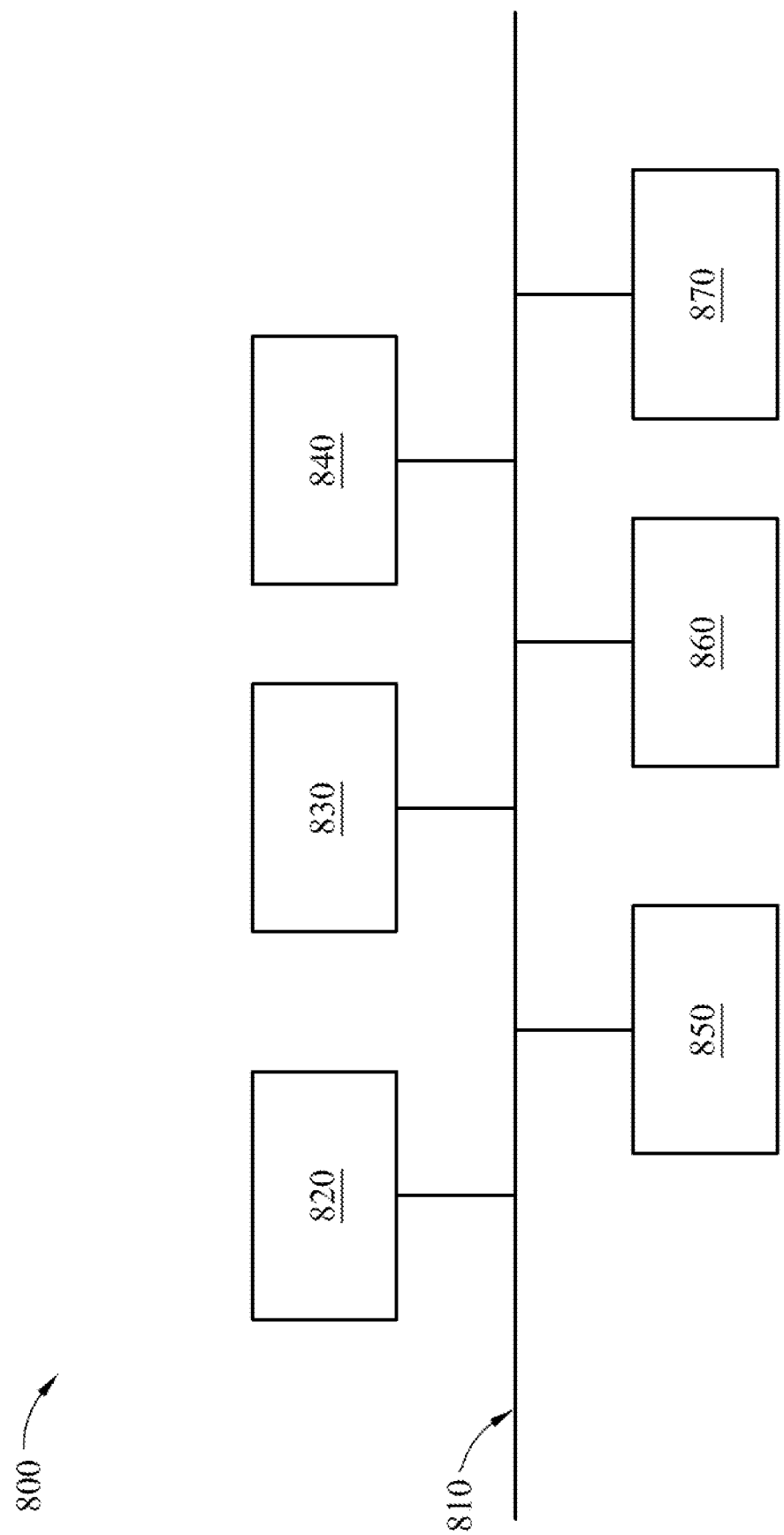
FIG. 8 is a diagram of example components of one or more devices of FIG. 1 described herein.

FIG. 8 is a diagram of example components of a device 800, which may correspond to the controller 132, the sensor 214, the signal generator 602, the signal detector 604, the communication interface 606, and/or another component described herein. In some implementations, the controller 132, the sensor 214, the signal generator 602, the signal detector 604, the communication interface 606, and/or another component described herein may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
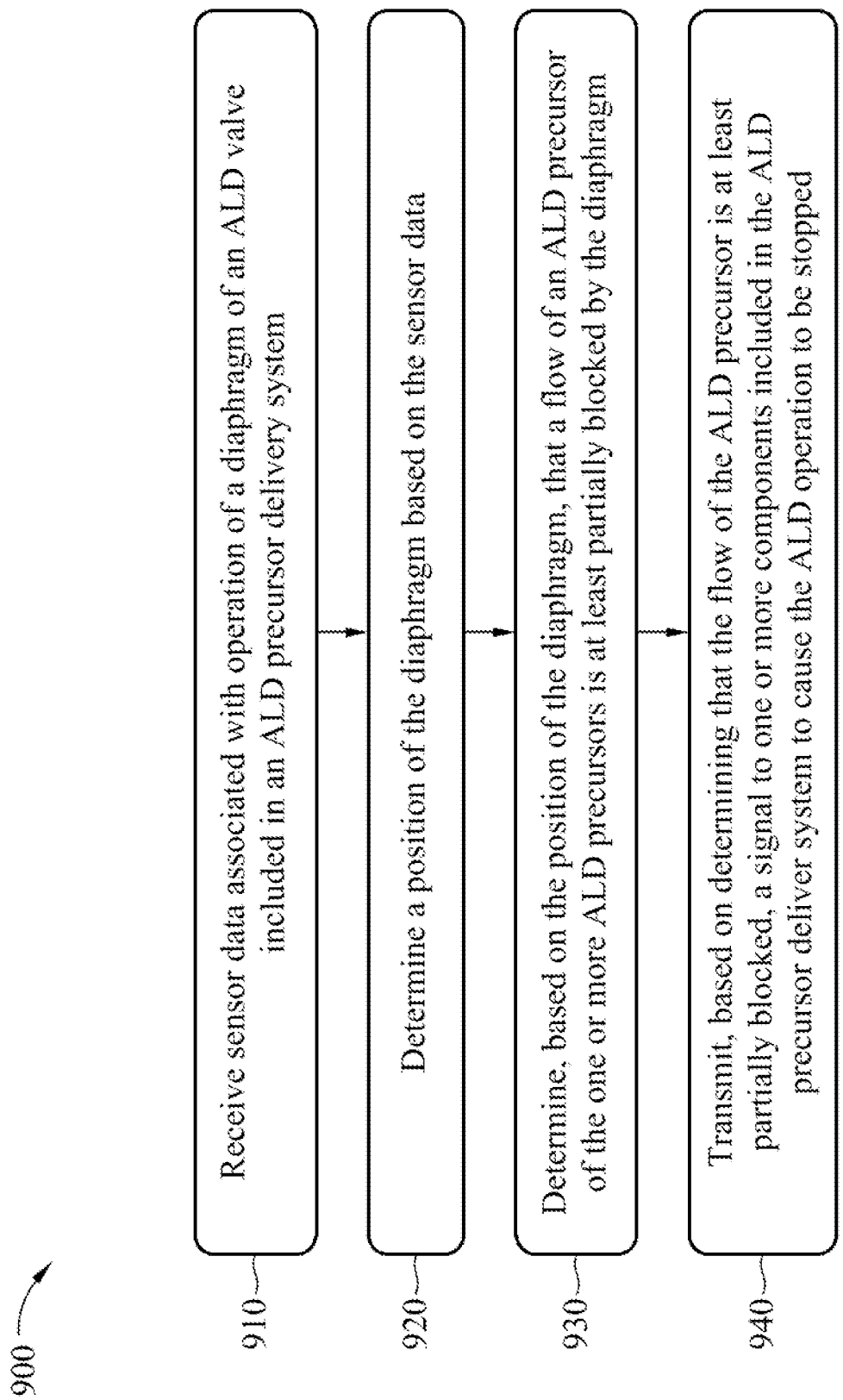
FIG. 9 is a flowchart of an example process relating to monitoring a valve in a vapor delivery system described herein.

FIG. 9 is a flowchart of an example process 900 associated with monitoring a valve in a vapor delivery system. In some implementations, one or more process blocks of FIG. 9 may be performed by a controller (e.g., the controller 132). In some implementations, one or more process blocks of FIG. 9 may be performed by another device or a group of devices separate from or including the controller, such as a sensor included in a valve (e.g., the sensor 214 included in a valve 128). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include receiving sensor data associated with operation of a diaphragm of an ALD valve included in an ALD precursor delivery system (block 910). For example, the controller 132 may receive sensor data (e.g., the sensor data 504, 706) associated with operation of a diaphragm (e.g., the diaphragm 206) of an ALD valve (e.g., one of the valves 128-1-128-13) included in an ALD precursor delivery system (e.g., the vapor delivery system 100), as described above. In some implementations, the sensor data is received from a sensor (e.g., the sensor 214) included in the ALD valve. In some implementations, the sensor data is received during an ALD operation associated with a semiconductor substrate (e.g., the semiconductor substrate 702) in which the ALD precursor delivery system supplies one or more ALD precursors to an ALD tool (e.g., the deposition tool 102).

As further shown in FIG. 9, process 900 may include determining a position of the diaphragm based on the sensor data (block 920). For example, the controller 132 may determine a position of the diaphragm based on the sensor data, as described above.

As further shown in FIG. 9, process 900 may include determining, based on the position of the diaphragm, that a flow of an ALD precursor of the one or more ALD precursors is at least partially blocked by the diaphragm (block 930). For example, the controller 132 may determine, based on the position of the diaphragm, that a flow of an ALD precursor of the one or more ALD precursors is at least partially blocked by the diaphragm, as described above.

As further shown in FIG. 9, process 900 may include transmitting, based on determining that the flow of the ALD precursor is at least partially blocked, a signal to one or more components included in the ALD precursor deliver system to cause the ALD operation to be stopped (block 940). For example, the controller may transmit, based on determining that the flow of the ALD precursor is at least partially blocked, a signal (e.g., the signal 710) to one or more components included in the ALD precursor deliver system to cause the ALD operation to be stopped, as described above. In some implementations, the signal that is to cause the ALD operation to be stopped reduces semiconductor substrate scrap that would otherwise be caused by the flow of the ALD precursor being at least partially blocked.

Process 900 may include additional implementations, such as any single implementation or any combination of implementations described below and/or in connection with one or more other processes described elsewhere herein.

In a first implementation, the sensor data includes information identifying signal intensity of a signal (e.g., the signal 502) reflected off of the diaphragm, and determining that the flow of the ALD precursor is at least partially blocked by the diaphragm includes performing, based on the signal intensity, a flow analysis of the flow of the ALD precursor through the ALD valve, where the flow analysis includes analyzing the signal intensity over time during the ALD operation and determining, based on the flow analysis, that a flow rate of the flow of the ALD precursor through the ALD valve does not satisfy a threshold flow rate (e.g., is less than the threshold flow rate).

In a second implementation, alone or in combination with the first implementation, the sensor data includes information identifying signal intensity of a signal (e.g., the signal 502) reflected off of the diaphragm, and determining that the flow of the ALD precursor is at least partially blocked by the diaphragm includes performing, based on the signal intensity, a flow analysis of the flow of the ALD precursor through the ALD valve, where the flow analysis includes analyzing the signal intensity over time during the ALD operation, determining, based on the flow analysis, an estimated deposition thickness on the semiconductor substrate, and determining that the estimated deposition thickness does not satisfy a deposition thickness parameter (e.g., is less than the deposition thickness parameter) for the ALD operation.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a diaphragm position of a valve may be detected and/or determined such that operation of the diaphragm may be monitored. A sensor included in the valve may generate sensor data that may be used to monitor the position of the diaphragm, which in turn may be used to determine a flow of a fluid (e.g., a liquid-based or gas-based precursor flow, a carrier gas flow) through the valve. In this way, the sensor (and the sensor data generated by the sensor) may be used to determine whether the diaphragm is properly functioning (e.g., whether the diaphragm is opening and closing as intended), may be used to identify and detect failures of the diaphragm, and/or may be used to quickly terminate operation of an associated deposition tool. This may enable the quick detection of an unopened valve failure, which may reduce the likelihood that a deposition operation is performed in the presence of the unopened valve failure. This may reduce semiconductor substrate scrap, may reduce device failures on semiconductor substrates that are processed by the deposition tool, may increase semiconductor processing quality of the deposition tool, and/or may increase semiconductor processing yields of the deposition tool.

As described in greater detail herein, some implementations described herein provide a valve for use in a vapor delivery system associated with a semiconductor processing tool for depositing a thin film (e.g., an ALD film) on a semiconductor substrate. The valve includes a valve housing, a fluid inlet configured to receive a processing fluid, and a fluid outlet (204) configured to provide the processing fluid, and a diaphragm. The diaphragm is configured to deform between two configurations, including, a closed configuration in which the diaphragm is to block the processing fluid from flowing from the fluid inlet to the fluid outlet, and an open configuration in which the diaphragm is to permit the processing fluid from flowing from the fluid inlet to the fluid outlet. The valve further includes a sensor, included in the valve housing, configured to generate sensor data associated with deformation of the diaphragm and to provide the sensor data to a controller of the vapor delivery system to enable the controller to determine a position of the diaphragm and to determine a flow of the processing fluid through the valve. The position of the diaphragm and the flow of the processing fluid through the valve are to be used to detect a failure of the diaphragm.

As described in greater detail herein, some implementations described herein provide a method. The method includes receiving, by a controller of an ALD precursor delivery system, sensor data associated with operation of a diaphragm of an ALD valve included in the ALD precursor delivery system, where the sensor data is received from a sensor included in the ALD valve, and where the sensor data is received during an ALD operation associated with a semiconductor substrate in which the ALD precursor delivery system supplies one or more ALD precursors to an ALD tool. The method includes determining, by the controller, a position of the diaphragm based on the sensor data. The method includes determining, by the controller and based on the position of the diaphragm, that a flow of an ALD precursor of the one or more ALD precursors is at least partially blocked by the diaphragm. The method includes transmitting, by the controller and based on determining that the flow of the ALD precursor is at least partially blocked, a signal to one or more components included in the ALD precursor deliver system to cause the ALD operation to be stopped. The signal that is to cause the ALD operation to be stopped reduces semiconductor substrate scrap that would otherwise be caused by the flow of the ALD precursor being at least partially blocked.

As described in greater detail herein, some implementations described herein provide an ALD supply system. The ALD supply system includes one or more gas sources, each configured to supply a gas in the ALD supply system. The ALD supply system includes a plurality of gas manifolds, each configured to selectively supply a plurality of types of gasses in the ALD supply system. The ALD supply system includes an ampoule configured to supply a vaporized precursor in the ALD supply system. The ALD supply system includes a PVM configured to selectively dispense the plurality of types of gasses, the vaporized precursor, or a combination thereof to a showerhead included in an ALD chamber for depositing a thin film (e.g., an ALD film) on a semiconductor substrate. The an ALD supply system includes a plurality of valves, including at least one of. The ALD supply system includes one or more first valves between components of the ALD supply system. The ALD supply system includes one or more second valves between components of the ALD supply system and the showerhead. The ALD supply system includes one or more third valves included in the PVM. A valve, of the one or more first valves, the one or more second valves, or the one or more third valves, includes a diaphragm configured to control a flow through the valve and a distance sensor configured to generate sensor data based on an amount of displacement of the diaphragm. The ALD supply system includes a controller 132 configured to receive the sensor data from the distance sensor and detect, based on the sensor data, abnormal operation of the diaphragm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An atomic layer deposition (ALD) supply system, comprising:
    one or more gas sources, each configured to supply a gas in the ALD supply system;
    a plurality of gas manifolds, each configured to selectively supply a plurality of types of gasses in the ALD supply system;
    an ampoule configured to supply a vaporized precursor in the ALD supply system;
    a point-of-use valve manifold (PVM) configured to selectively dispense the plurality of types of gasses, the vaporized precursor, or a combination thereof to a showerhead included in an ALD chamber for depositing a thin film on a semiconductor substrate;
    comprising:
        a diaphragm configured to control a flow through the valve, and
        a distance sensor configured to:
            transmit a distance measurement signal toward the diaphragm,
            generate sensor data based on an intensity of a reflected distance measurement signal that is based on a reflection of the distance measurement signal; and
    a controller configured to:
        receive the sensor data from the distance sensor, and
        detect, based on the sensor data, abnormal operation of the diaphragm.

2. The ALD supply system of claim 1, further comprising:
    a fluid inlet;
    a fluid outlet;
    wherein the diaphragm, to control the flow through the valve, is configured to:
        control the flow between the fluid inlet and the fluid outlet; and
    wherein the controller, to detect abnormal operation of the diaphragm, is configured to:
        detect, based on the sensor data, a failure of the diaphragm to open such that the flow is permitted between the fluid inlet and the fluid outlet.

3. The ALD supply system of claim 1, wherein the distance sensor comprises:
    a signal generator configured to transmit the distance measurement signal toward the diaphragm;
    a signal detector configured to generate the sensor data based on the intensity of the reflected distance measurement signal that is based on the reflection of the distance measurement signal; and
    a communication interface configured to transmit the sensor data to the controller.

4. The ALD supply system of claim 3, wherein the signal generator, to transmit the distance measurement signal toward the diaphragm, is configured to:

transmit the distance measurement signal onto the diaphragm at an angle, relative to a surface of the diaphragm, that is in a range of approximately 30 degrees to approximately 75 degrees.

5. The ALD supply system of claim 3, wherein the signal generator, to transmit the distance measurement signal toward the diaphragm, is configured to:
  transmit the distance measurement signal onto an outer region of the diaphragm that surrounds an inner region that interfaces with a valve stem of the valve.

6. The ALD supply system of claim 5, wherein a first ratio, between a first width of the inner region and a radius of the diaphragm is in a first range of greater than 0 to approximately 0.2; and
  wherein a second ratio between a second width of the outer region and the radius of the diaphragm is in a second range of approximately 0.2 to approximately 1.

7. The ALD supply system of claim 1, wherein abnormal operation of the diaphragm is caused by at least one of:
  material fatigue of the diaphragm,
  precursor condensation on the diaphragm, or
  an impurity blockage associated with the diaphragm.

8. The ALD supply system of claim 1, wherein the controller is further configured to:
  cause, based on detecting the abnormal operation of the diaphragm, the ALD supply system to stop selectively dispensing the plurality of types of gasses, the vaporized precursor, or the combination thereof to the showerhead included in the ALD chamber before a greater quantity than 1 semiconductor substrate is scrapped.

9. The ALD supply system of claim 1, wherein the distance sensor is included in a housing of the valve at a location such that a piston of the valve and a valve stem of the valve do not interfere with generation of the sensor data by the distance sensor.

10. An atomic layer deposition (ALD) supply system, comprising:
  one or more gas sources, each configured to supply a gas in the ALD supply system;
  a plurality of gas manifolds, each configured to selectively supply a plurality of types of gasses in the ALD supply system;
  an ampoule configured to supply a vaporized precursor in the ALD supply system;
  a point-of-use valve manifold (PVM) configured to selectively dispense the plurality of types of gasses, the vaporized precursor, or a combination thereof to a showerhead included in an ALD chamber for depositing a thin film on a semiconductor substrate;
  a valve comprising:
    a diaphragm configured to deform between two configurations, including:
      a closed configuration to block a flow through the valve, and
      an open configuration to permit the flow through the valve, and
    a sensor, comprising a laser sensor, an infrared sensor, or a radar sensor, configured to generate sensor data associated with the diaphragm; and
  a controller configured to:
    receive the sensor data from the sensor, and
    determine, based on the sensor, a position of the diaphragm, and a presence of the flow through the valve
    detect, based on the sensor data, abnormal operation of the diaphragm.

11. The ALD supply system of claim 10, wherein the sensor includes a distance sensor;
  wherein the sensor, to generate the sensor data associated with the diaphragm, is configured to:
    emit a distance measurement signal toward the diaphragm; and
    generate the sensor data based on an intensity of a reflected distance measurement signal,
      wherein the reflected distance measurement signal is reflected off of the diaphragm, and
      wherein the intensity of the reflected distance measurement signal is based on a distance between the diaphragm and the sensor and an angle of the diaphragm relative to an angle of the distance measurement signal.

12. The ALD supply system of claim 11, wherein the intensity of the reflected distance measurement signal is greater when the diaphragm is in the open configuration than when the diaphragm is in the closed configuration.

13. The ALD supply system of claim 11, wherein the sensor, to emit the distance measurement signal toward the diaphragm, is configured to:
  emit the distance measurement signal onto a measurement point on the diaphragm,
    wherein the measurement point is located an offset from a center of the diaphragm so as to prevent a valve stem of the valve from interfering with the distance measurement signal.

14. The ALD supply system of claim 13, wherein a ratio between the offset and a radius of the diaphragm is in a range of approximately 0.2 to approximately 1.

15. The ALD supply system of claim 10, wherein the valve further comprises:
  a valve stem configured to selectively actuate the diaphragm between the open configuration and the closed configuration; and
  a piston configured to actuate the valve stem,
    wherein the sensor is located between the diaphragm and the piston,
    wherein the sensor is located adjacent to the valve stem, and
    wherein the position of the diaphragm and the presence of the flow through the valve are to be used to detect an unopened failure of the diaphragm.

16. An atomic layer deposition (ALD) supply system, comprising:
  a controller configured to:
    receive sensor data includes information identifying signal intensity of a signal reflected off of a diaphragm of an ALD valve included in the ALD supply system,
      wherein the sensor data is received from a sensor included in the ALD valve, and
      wherein the sensor data is received during an ALD operation associated with a semiconductor substrate in which the ALD supply system supplies one or more ALD precursors to an ALD tool;
    determine a position of the diaphragm based on the sensor data;
    determine, based on the position of the diaphragm, that a flow of an ALD precursor of the one or more ALD precursors is at least partially blocked by the diaphragm, wherein at least one of the position of the diaphragm or the flow of the ALD precursor is based on the signal intensity; and
    transmit, based on determining that the flow of the ALD precursor is at least partially blocked, a signal to one or more components included in the ALD precursor deliver system to cause the ALD operation to be stopped.

17. The ALD supply system of claim 16, wherein the controller, to determine the position of the diaphragm, is configured to:
determine the position of the diaphragm based on the signal intensity; and
wherein the controller, to determine that the flow of the ALD precursor is at least partially blocked by the diaphragm, is configured to:
determine that the signal intensity does not satisfy a threshold signal intensity,
wherein the signal intensity not satisfying the threshold signal intensity is indicative of the position of the diaphragm being a closed position of the diaphragm.

18. The ALD supply system of claim 16, wherein the controller, to determine that the flow of the ALD precursor is at least partially blocked by the diaphragm, is configured to:
perform, based on the signal intensity, a flow analysis of the flow of the ALD precursor through the ALD valve, wherein the flow analysis includes analyzing the signal intensity over time during the ALD operation; and
determine, based on the flow analysis, that a flow rate of the flow of the ALD precursor through the ALD valve does not satisfy a threshold flow rate.

19. The ALD supply system of claim 16, wherein the controller, to determine that the flow of the ALD precursor is at least partially blocked by the diaphragm, is configured to:
perform, based on the signal intensity, a flow analysis of the flow of the ALD precursor through the ALD valve, wherein the flow analysis includes analyzing the signal intensity over time during the ALD operation;
determine, based on the flow analysis, an estimated deposition thickness on the semiconductor substrate; and
determine that the estimated deposition thickness does not satisfy a deposition thickness parameter for the ALD operation.

20. The ALD supply system of claim 10, wherein the sensor is included in a housing of the valve at a location such that a piston of the valve and a valve stem of the valve do not interfere with generation of the sensor data by the sensor.

* * * * *

UNITED STATES PATENT AND TRADEMARK OFFICE
CERTIFICATE OF CORRECTION

PATENT NO. : 12,131,962 B2
APPLICATION NO. : 17/446242
DATED : October 29, 2024
INVENTOR(S) : Kuang-Wei Cheng et al.

Page 1 of 1

It is certified that error appears in the above-identified patent and that said Letters Patent is hereby corrected as shown below:

In the Claims

Claim 1:
Column 18, Line 29, change "comprising:" to -- a valve comprising: --

Signed and Sealed this
Twenty-fifth Day of February, 2025

Coke Morgan Stewart
*Acting Director of the United States Patent and Trademark Office*